US012598729B2

(12) United States Patent
    Wang

(10) Patent No.: US 12,598,729 B2
(45) Date of Patent: Apr. 7, 2026

(54) ELECTROSTATIC DISCHARGE PROTECTION DEVICE AND METHOD THEREOF

(71) Applicant: NANYA TECHNOLOGY CORPORATION, New Taipei City (TW)

(72) Inventor: Kuo-Chiang Wang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 194 days.

(21) Appl. No.: 18/500,681

(22) Filed: Nov. 2, 2023

(65) Prior Publication Data
    US 2025/0151249 A1     May 8, 2025

(51) Int. Cl.
    *H05K 9/00*          (2006.01)
(52) U.S. Cl.
    CPC .................................. *H05K 9/0067* (2013.01)
(58) Field of Classification Search
    CPC .... H05K 9/0067; G01R 31/002; H01L 27/02; H01L 23/66; H01L 27/0281; H01L 23/60; H02H 9/04; H02H 9/046
    USPC .......................................................... 361/56
    See application file for complete search history.

(56) References Cited

U.S. PATENT DOCUMENTS

| | | | | |
|---|---|---|---|---|
| 10,922,456 | B1 * | 2/2021 | Chowdhury | ............ G06F 30/31 |
| 2012/0243133 | A1 * | 9/2012 | Wu | ......................... H02H 9/046 |
| | | | | 361/56 |
| 2018/0054054 | A1 * | 2/2018 | Singor | ................. H10D 89/611 |
| 2018/0143233 | A1 * | 5/2018 | Graf | ..................... H10D 89/601 |
| 2018/0337170 | A1 * | 11/2018 | Kanawati | ................ H01L 23/60 |
| 2022/0293534 | A1 * | 9/2022 | Hung | ................... H10D 89/811 |

FOREIGN PATENT DOCUMENTS

TW          202236590 A       9/2022

OTHER PUBLICATIONS

Ming-Dou Ker, et al., ESD Protection Design With Low-Capacitance Consideration for High-Speed/High-Frequency I/O Interfaces in Integrated Circuits, Recent Patents on Engineering, Jun. 2007, 131-145, vol. 1, Bentham Science Publishers Ltd., Netherlands.

* cited by examiner

*Primary Examiner* — Danny Nguyen
(74) *Attorney, Agent, or Firm* — CKC & Partners Co., LLC

(57)          ABSTRACT
An ESD (electrostatic discharge) protection device is disclosed. The ESD protection device is configured to protect an internal circuit. The ESD protection device includes an ESD protection array and a control circuit. The ESD protection array includes several ESD protection units. The control circuit is coupled to the ESD protection array. The control circuit is configured to control a conduction of each of the several ESD protection units so that a determined number of the several ESD protection units are conducted.

12 Claims, 5 Drawing Sheets

170 detecting circuit
110 logical circuit
130 control circuit
150

ESD protection array
170 internal circuit
20

300

S310 receiving a control signal

S330 controlling a conduction of each of several ESD protection units of the ESD protection array of the ESD protection device according to the control signal so that a determined number of the several ESD protection units are conducted

ELECTROSTATIC DISCHARGE PROTECTION DEVICE AND METHOD THEREOF

BACKGROUND

Technical Field

The present disclosure relates to an ESD (electrostatic discharge) protection device and an ESD protection method. More particularly, the present disclosure relates to an ESD protection device and an ESD protection method for dynamically adjusting the conducted number of the ESD protection units.

Description of Related Art

Electrostatic discharge (ESD) occurs when two differently-charged objects contact with each other. For example, when a pad of an internal circuit of an electronic device contacts a charged object, such as human body or a circuit board, an ESD event would occur. In such case, a drastic discharge current will be induced on the pad of the internal circuit of an electronic device so as to discharge charges accumulated in the internal circuit of an electronic device or the charged object. To protect components in the internal circuit of an electronic device from being damaged by the drastic and intensive discharge current, ESD protection circuits are often added to the internal circuit of the electronic device.

For an ESD protection circuit, the more ESD paths are comprised, the less discharging time is needed, and the more robust the ESD protection circuit is. On the other hand, if there are more ESD paths (or more diodes are used in the ESD paths) in the ESD protection circuit, the larger the parasitic capacitance is, and the performance of the signals of the internal circuit will be degraded much seriously.

Therefore, how to improve performance of the ESD protection circuits while reducing parasitic capacitance of the ESD protection circuits is a problem to be solved. Several methods are proposed to solve the problem as mentioned above, however, improving the performance of the ESD protection circuits while reducing parasitic capacitance of the ESD protection circuits is physically conflict.

SUMMARY

An aspect of the present disclosure is to provide an ESD (electrostatic discharge) protection device. The ESD protection device is configured to protect an internal circuit. The ESD protection device includes an ESD protection array and a control circuit. The ESD protection array includes several ESD protection units. The control circuit is coupled to the ESD protection array. The control circuit is configured to control a conduction of each of the several ESD protection units so that a determined number of the several ESD protection units are conducted.

Another aspect of the present disclosure is to provide an ESD protection method. The ESD protection method is suitable for an ESD protection device. The ESD protection device is configured to protect an internal circuit. The ESD protection method includes the following operations: receiving a control signal by a control circuit of the ESD protection device, wherein the control signal comprises a protection level and a determined number in correspondence; and controlling a conduction of each of several ESD protection units of a ESD protection array of the ESD protection device according to the control signal by the control circuit so that the determined number of the several ESD protection units are conducted.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
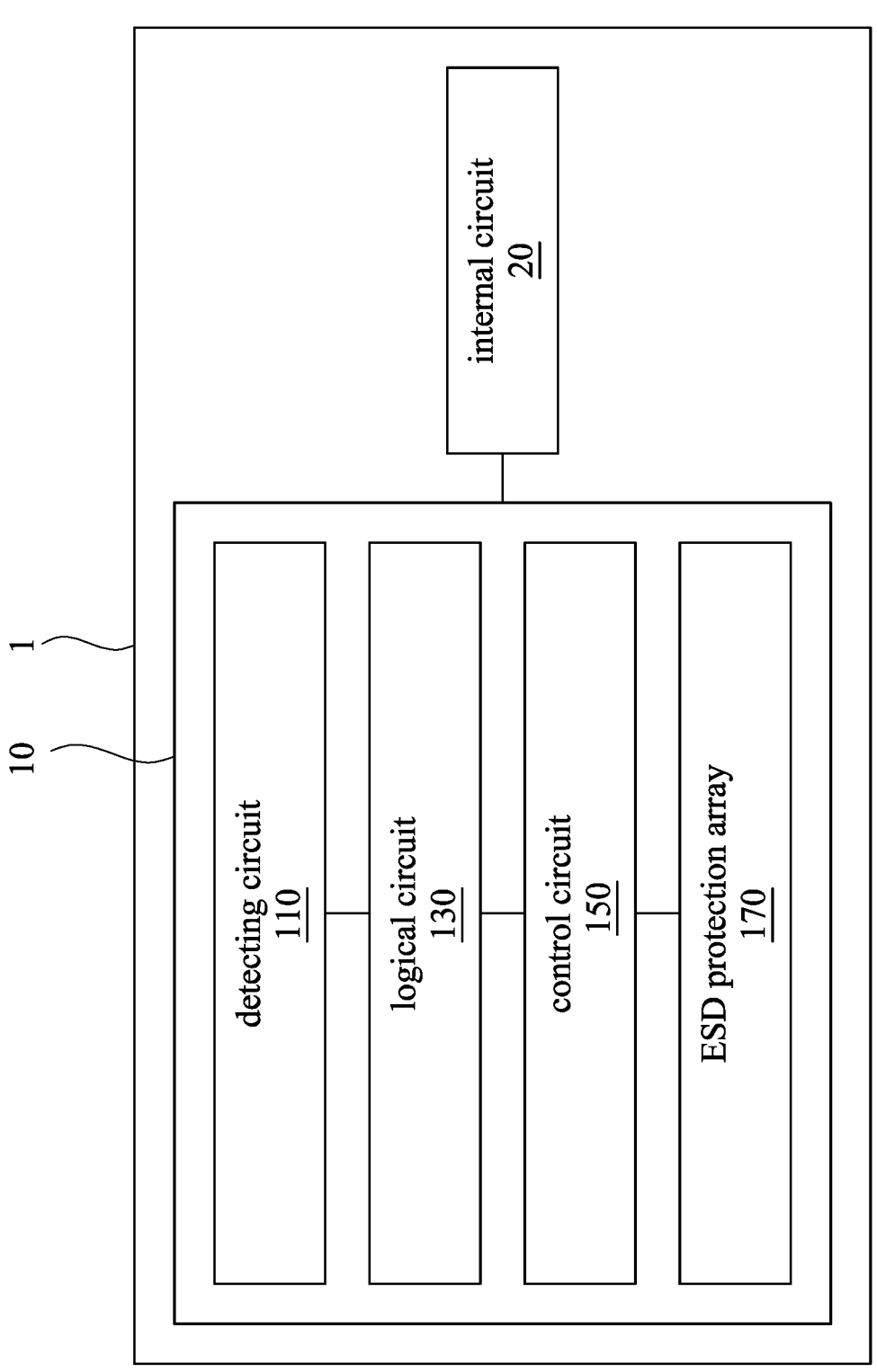
FIG. 1 is a schematic diagram of an electronic device according to some embodiments of the present disclosure.

Reference is made to FIG. 1. FIG. 1 is a schematic diagram of an electronic device 1 according to some embodiments of the present disclosure. The electronic device 1 includes an internal circuit 20 and an ESD protection device 10. The internal circuit 20 is coupled to the ESD protection device 10.

In some embodiments, the ESD protection device 10 includes a control circuit 150 and an ESD protection array 170. The control circuit 150 is coupled to the ESD protection array 170.

In some embodiments, the ESD protection device 10 further includes a detecting circuit 110 and a logical circuit 130. The detecting circuit 110 is coupled to the logical circuit 130, and the logical circuit 130 is coupled to the control circuit 150.

Figure 2:
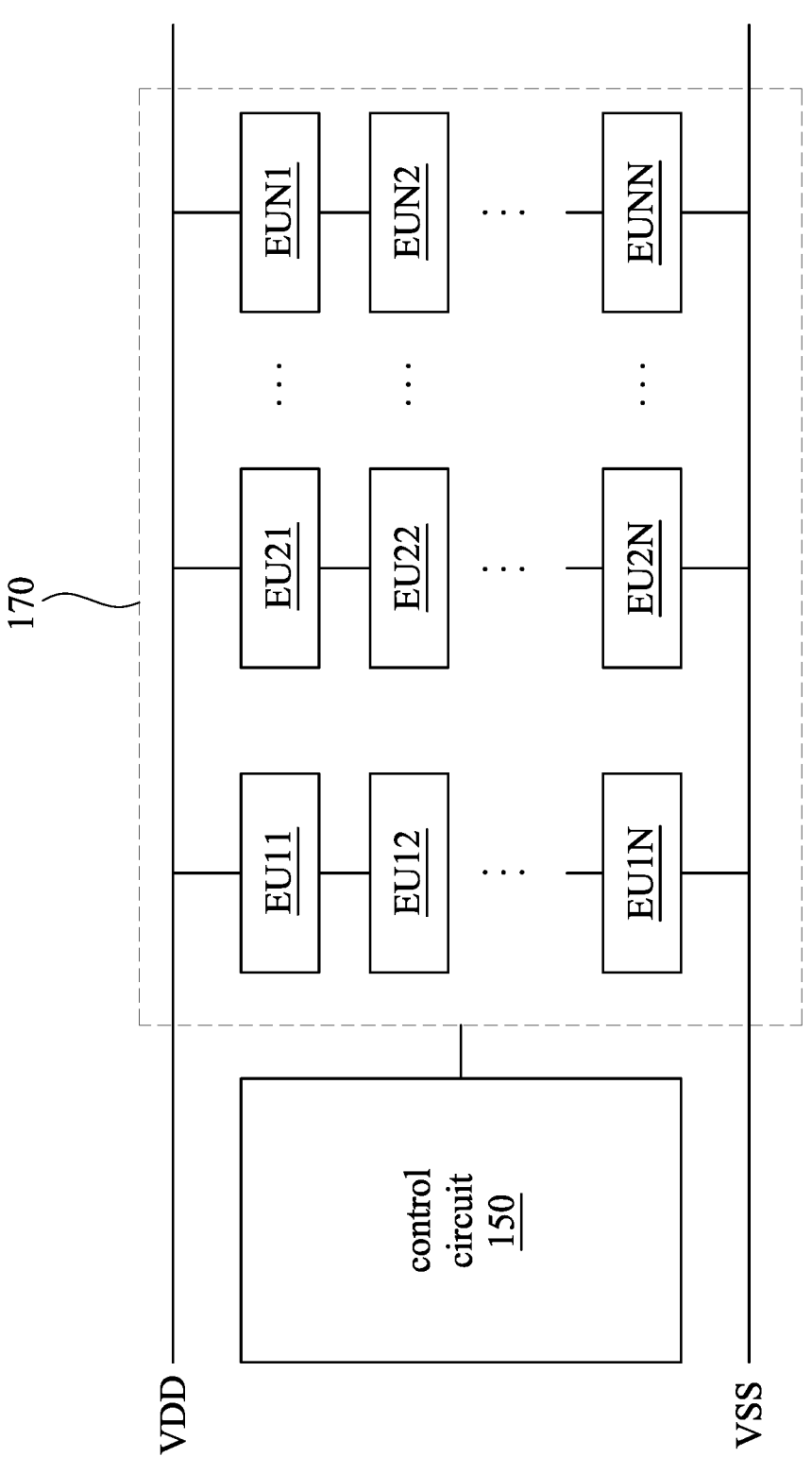
FIG. 2 is a schematic diagram of an ESD protection array according to some embodiments of the present disclosure.

Reference is made to FIG. 2. FIG. 2 is a schematic diagram of an ESD protection array 170 according to some embodiments of the present disclosure. As illustrated in FIG. 2, the ESD protection array 170 is coupled to the control circuit 150. The ESD protection array 170 includes several ESD protection units EU11 to EUNN. The several ESD protection units EU11 to EUNN are arranged in rows and columns.

One terminal of the ESD protection array 170 is coupled to the power supply VDD, another terminal of the ESD protection array 170 is coupled to the power supply VSS. In some embodiments, the power supply VSS is the ground.

As illustrated in FIG. 2, some of the ESD protection unit EU11 to EUNN are connected in series, and some of the ESD protection units EU11 to EUNN are connected in parallel. For example, the ESD protection unit EU11 and the ESD protection unit EU12 are connected in series, and the ESD protection unit EU11 and the ESD protection unit EU21 are connected in parallel.

The detail operations of the ESD protection device 10 will be described in detail with FIG. 3 as follows.

The ESD protection device 10 as illustrated in FIG. 1 is for illustrative purposes only, and the embodiments of the present disclosure are not limited thereto. The operation method of the ESD protection device 10 as illustrated in FIG. 1 will be described in detail with reference to FIG. 3.

Figure 3:
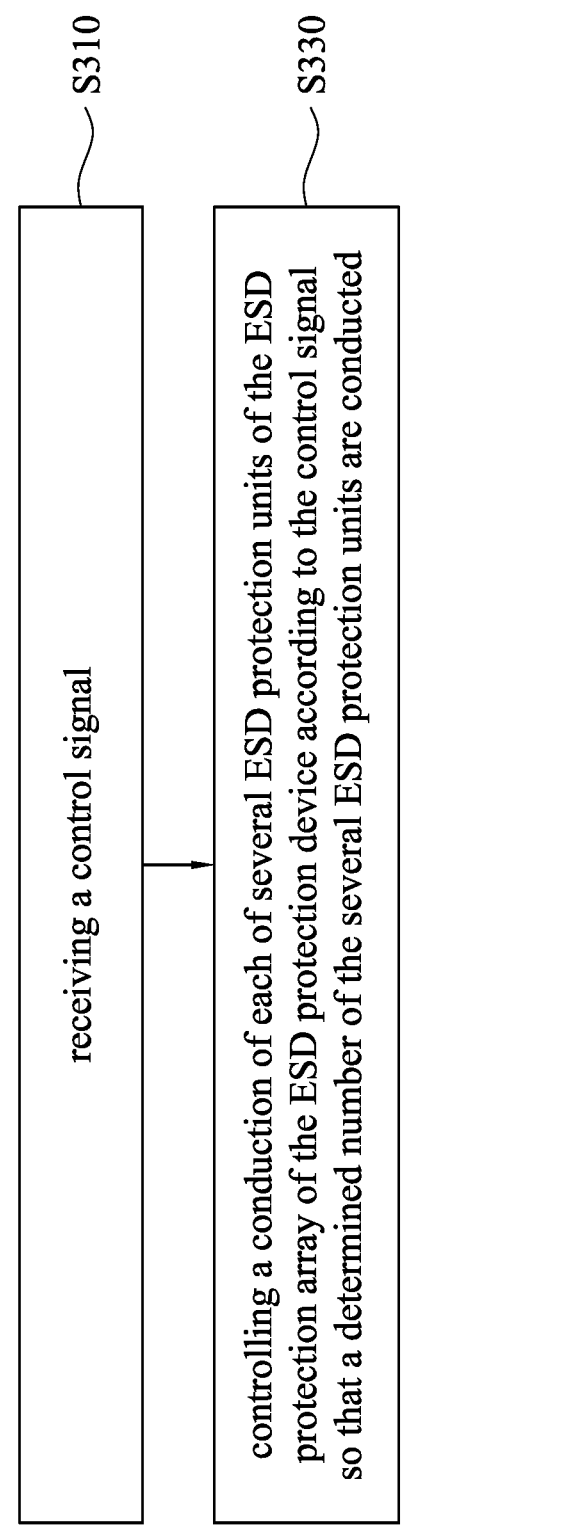
FIG. 3 is a flow chart of an ESD protection method according to some embodiments of the present disclosure.

Reference is made to FIG. 3. FIG. 3 is a flow chart of an ESD protection method 300 according to some embodiments of the present disclosure. The ESD protection method 300 includes operations S310 and S330. These operations are given for illustrative purposes. Additional operations are within the contemplated scoped of the present disclosure.

In operation S310, a control signal is received. In some embodiments, in operation S310, the control circuit 150 as illustrated in FIG. 1 sends a control signal to the ESD protection array 170 as illustrated in FIG. 1.

In some embodiments, the detecting circuit 110 as illustrated in FIG. 1 detects a voltage value or a current value of the internal circuit 20. In some embodiments, the voltage value or the current value is an input voltage value or an input current value input to the internal circuit 20 from other circuits (not shown) of the electronic device 1.

In some embodiments, the detecting circuit 110 transmits the detected voltage value or the detected current value of the internal circuit 20 to the logical circuit 130. The logical circuit 130 decides a determined number according to the detected voltage value or the detected current value. In some embodiments, the logical circuit 130 further determines the conduction of each of the several ESD protection units EU11 to EUNN according to the detected voltage value or the detected current value.

In some embodiments, the logical circuit 130 determines a corresponding protection value according to the detected voltage value or the detected current value. The higher the protection value, the higher the determined value, and more of the ESD protection units EU11 to EUNN are conducted. The more the ESD protection units EU11 to EUNN are conducted, the better the ESD protection efficiency is. However, the more the ESD protection units EU11 to EUNN are conducted, the higher the inductive capacitance is, and the worse the signal transmission quality is.

In an embodiment, the logical circuit 130 determines the determined number of the conducted ESD protection units EU11 to EUNN according to table 1 as follows. The table 1 as illustrated in the follows is for illustrative purposes only, and the embodiments of the present disclosure are not limited thereto.

4

TABLE 1

| Voltage value | Protection level | Determined number |
|---|---|---|
| voltage value ≥ first threshold value | 3(high) | 10 |
| first threshold value > voltage value ≥ threshold second threshold value | 2 | 6 |
| second threshold value> voltage value | 1(low) | 4 |

According to table 1, for example, when the voltage value is smaller than the second threshold value, the corresponding protection level is level 1, and the determined number is 4. In an embodiment, the table 1 further includes the ESD protection units to be conducted. For example, in one embodiment, when the determined number is 4, the ESD protection units EU11, EU21, EU12 and EU22 are conducted.

In some embodiments, the logical circuit 130 includes an ADC (analog to digital conversion) circuit. The ADC circuit transfers the voltage value or the current value detected by the detecting circuit 110 in to digital signals, and the logical circuit 130 determines the protection level or the determined number according to the digital signals.

In some other embodiments, the logical circuit 130 receives a command signal, and the logical circuit 130 decides the conduction of each of the several ESD protection units EU11 to EUNN and decides the determined number according to the command signal.

In some embodiments, the command signal includes information of the tolerable capacitance value. According to the tolerable capacitance value, the logical circuit 130 decides the determined value and decides which of the conducted ESD protection units should be conducted.

For example, in an embodiment, the determined number corresponding to the tolerable capacitance value is 4, and when the determined number is 4, the ESD protection units EU11, EU21, EU12 and EU22 are determined to be conducted. That is, four of the ESD protection units EU11 to EUNN are conducted.

In some embodiments, the higher the tolerable capacitance value, the higher the protection level and the more of the ESD protection units are determined to be conducted.

In some other embodiments, the command signal includes information of an operation stage of the internal circuit 20. For example, in some embodiments, the command signal includes information of whether the internal circuit 20 is operated in a starting stage or not.

When according to the command signal, the internal circuit 20 is operated in the starting stage and variation of a working voltage of the internal circuit 20 is higher than a variation threshold, that is, the working voltage of the internal circuit 20 is unstable, in this situation, a first number of the ESD protection units EU11 to EUNN are then conducted. On the other hand, when according to the command signal, the internal circuit is not operated in the starting stage and the variation of the working voltage of the internal circuit 20 is not higher than the variation threshold, that is, the working voltage of the internal circuit 20 is stable, a second number of the ESD protection units EU11 to EUNN are conducted. The first number is larger than the second number.

In some embodiments, the logical circuit 130 determines the determined number of the conducted ESD protection units EU11 to EUNN according to table 2 as follows. The table 2 as illustrated in the follows is for illustrative purposes only, and the embodiments of the present disclosure are not limited thereto.

TABLE 2

| Operation stage | Protection level | Determined number |
| --- | --- | --- |
| starting stage | 2(high) | 10 |
| normal stage | 1(low) | 6 |

According to table 2, when the internal circuit 20 is operated in the starting stage, the corresponding protection level is level 2, and the determined number is 10. That is, 10 of the ESD protection units EU11 to EUNN are conducted. On the other hand, when the internal circuit 20 is not operated in the starting stage or is operated in the normal stage, the corresponding protection level is level 1, and the determined number is 6. That is, 6 of the ESD protection units EU11 to EUNN are conducted.

In some embodiments, the command signal includes information of whether the internal circuit 20 is operated in a data writing stage, in a data reading stage, or in an idle stage.

In some other embodiments, when the internal circuit 20 is operated in a data reading stage or a data writing stage, a third number of the ESD protection units EU11 to EUNN are conducted. On the other hand, when the internal circuit 20 is operated in an idle stage, a fourth number of the ESD protection units EU11 to EUNN are conducted. The third number is smaller than the fourth number.

In some embodiments, the logical circuit 130 determines the determined number of the conducted ESD protection units EU11 to EUNN according to table 3 as follows. The table 3 as illustrated in the follows is for illustrative purposes only, and the embodiments of the present disclosure are not limited thereto.

TABLE 3

| Operation stage | Protection level | Determined number |
| --- | --- | --- |
| idle stage | 2(high) | 10 |
| data reading stage or data writing stage | 1(low) | 6 |

According to table 3, when the internal circuit 20 is operated in the idle stage, the corresponding protection level is level 2, and the determined number is 10. That is, 10 of the ESD protection units EU11 to EUNN are conducted. On the other hand, when the internal circuit 20 is operated in the data reading stage or the data writing stage, the corresponding protection level is level 1, and the determined number is 6. That is, 6 of the ESD protection units EU11 to EUNN are conducted.

In some other embodiments, the command signal includes information of an operation mode of the internal circuit 20. The operation mode includes a high speed transmission mode or a low speed transmission mode.

When the internal circuit 20 is operated in a high speed transmission mode, a fifth number of the ESD protection units EU11 to EUNN are conducted. On the other hand, when the internal circuit 20 is operated in a low speed transmission mode, a sixth number of the ESD protection units EU11 to EUNN are conducted. The fifth number is smaller than the sixth number.

In some embodiments, the logical circuit 130 determines the determined number of the conducted ESD protection units EU11 to EUNN according to table 4 as follows. The table 4 as illustrated in the follows is for illustrative purposes only, and the embodiments of the present disclosure are not limited thereto.

TABLE 4

| Operation mode | Protection level | Determined number |
| --- | --- | --- |
| low speed transmission mode | 2(high) | 10 |
| high speed transmission mode | 1(low) | 6 |

According to table 4, when the internal circuit 20 is operated in the low speed transmission mode, the corresponding protection level is level 2, and the determined number is 10. That is, 10 of the ESD protection units EU11 to EUNN are conducted. On the other hand, when the internal circuit 20 is operated in the high speed transmission mode, the corresponding protection level is level 1, and the determined number is 6. That is, 6 of the ESD protection units EU11 to EUNN are conducted.

In some embodiments, the high speed transmission mode includes the internal circuit 20 receiving signals through a high speed transmission interface, and the low speed transmission mode includes the internal circuit 20 receiving signals through a low speed transmission interface.

In some embodiments, the command signal includes information of the protection level or the determined number of the conducted ESD protection units EU11 to EUNN directly.

Reference is made to FIG. 1 again. In some embodiments, after the logical circuit 130 determines the protection level or the determined number of the conducted ESD protection units EU11 to EUNN according to the command signal or the detected voltage value or the detected current value from the detecting circuit 110, the logical circuit 130 generates a control signal according to the protection level or the determined number, and transmits the control signal to the control circuit 150. The control circuit 150 receives the control signal from the logical circuit 130.

In some embodiments, the logical circuit 130 further includes a memory. The memory stores the tables 1 to 4 as mentioned above.

In some embodiments, the information included in the command signal is detected by the detecting circuit 110. That is, the detecting circuit 110 detects the operation stage or the operation mode of the internal circuit 20 and generates the command signal according to the operation stage or the operation mode of the internal circuit 20.

In operation S330, controlling a conduction of each of several ESD protection units EU11 to EUNN of the ESD protection array 170 of the ESD protection device 10 according to the control signal so that a determined number of the several ESD protection units EU11 to EUNN are conducted. In some embodiments, the operation S330 is performed by the control circuit 150 as illustrated in FIG. 1.

Figure 4:
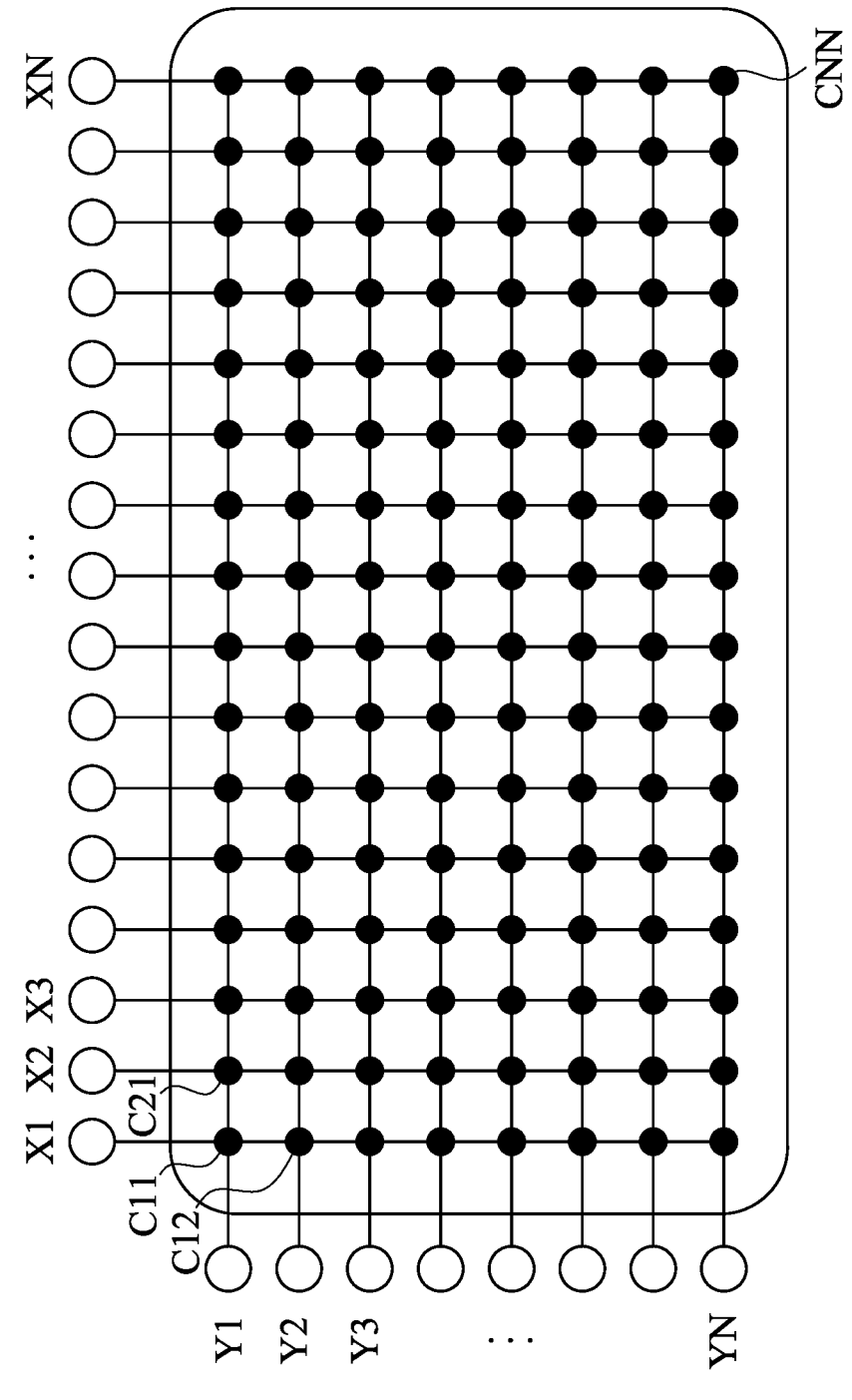
FIG. 4 is a schematic diagram of a switch array according to some embodiments of the present disclosure.

Reference is made to FIG. 4 together. FIG. 4 is a schematic diagram of a switch array 400 according to some embodiments of the present disclosure. In some embodiments, the control circuit 150 as illustrated in FIG. 1 includes the switch array 400, and the switch array 400 is connected to the internal circuit 20.

In some embodiments, as illustrated in FIG. 4, the switch array includes switches C11 to CNN. Details of the switch units C11 to CNN will be described in detail in reference to FIG. 5.

Figure 5:
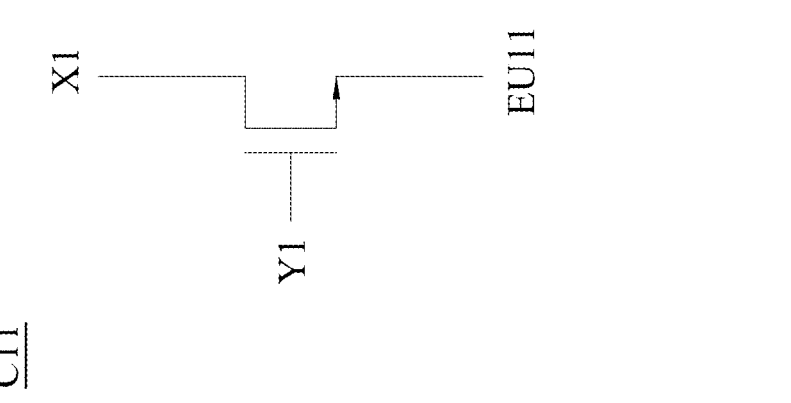
FIG. 5 is a schematic diagram of a switch unit according to some embodiments of the present disclosure.

FIG. 5 is a schematic diagram of a switch unit C11 according to some embodiments of the present disclosure. As illustrated in FIG. 5, a control terminal of the switch unit C11 is coupled to the voltage value Y1, a first terminal of the switch unit C11 is coupled to the voltage value X1, and a second terminal of the switch unit C11 is coupled to the ESD protection unit EU11. By controlling the voltage value X1 and Y1, the conduction of the ESD protection unit EU11 can be controlled.

Other switch units or similar to the switch unit C11 and will not be described in detail here. By controlling the voltage value X1 to XN and Y1 to YN as illustrated in FIG. 4, the control circuit 150 controls the conduction of each of the ESD protection units EU11 to EUNN.

In some other embodiments, the switch units C11 to CNN can be fuses. By blowing the fuse or not, the control circuit 150 controls the conduction of each of the ESD protection units EU11 to EUNN.

Each of the ESD protection units EU11 to EUNN as illustrated in FIG. 2 is a circuit including at least one diode connected between the power supply VDD and the power supply VSS. When one of the ESD protection units EU11 to EUNN is conducted, the at least one diode included in the one of the ESD protection units EU11 to EUNN is conducted. When the internal circuit 20 as illustrated in FIG. 1 encounters electrostatic attack, the electrostatic current flows through the at least one diode to the power supply VDD or the power supply VSS, so as to protect the internal circuit 20 from the electrostatic attack.

In the previous work, the number of the conducted ESD protection units EU11 to EUNN can not be adjusted dynamically. However, in the embodiments of the present disclosure, the conduction of each of the ESD protection units EU11 to EUNN can be adjusted dynamically, and the parasitic capacitance value caused by the conducted ESD protection units can be adjusted accordingly.

In sum, the embodiments of the present disclosure provide an ESD protection device and an ESD protection method, by dynamically adjusting the conduction of each of the ESD protection units of the ESD protection array, the parasitic capacitance value caused by the conducted ESD protection units can be adjusted accordingly, and the signal quality can be better. The embodiments of the present disclosure are suitable for electronical devices with different specifications and can meet the requirements of different customers.

In some embodiments, the electronic device 1 can be a DRAM (Dynamic Random Access Memory), but the embodiments of the present disclosure are not limited thereto.

In some embodiments, the internal circuit 20 can be a receiver circuit, but the embodiments of the present disclosure are not limited thereto.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An ESD (electrostatic discharge) protection device, configured to protect an internal circuit, wherein the ESD protection device comprises:

an ESD protection array, comprising a plurality of ESD protection units;

a control circuit, coupled to the ESD protection array, wherein the control circuit is configured to control a conduction of each of the plurality of ESD protection units so that a determined number of the plurality of ESD protection units are conducted;

a detecting circuit, configured to detect a voltage value or a current value of the internal circuit; and a logical circuit, coupled to the control circuit, wherein the logical circuit is configured to decide the conduction of each of the plurality of ESD protection units and the determined number according to the voltage value or the current value of the internal circuit.

2. The ESD protection device of claim 1, wherein the plurality of ESD protection units comprises a first ESD protection unit, a second ESD protection unit, and a third ESD protection unit, wherein the first ESD protection unit and the second ESD protection unit are connected in series, and the first ESD protection unit and the third ESD protection unit are connected in parallel.

3. The ESD protection device of claim 1, wherein when the internal circuit is operated in a starting stage and a variation of a working voltage of the internal circuit is higher than a variation threshold, a first number of the plurality of ESD protection units are conducted, wherein when the internal circuit is not operated in the starting stage and the variation of the working voltage of the internal circuit is not higher than the variation threshold, a second number of the plurality of ESD protection units are conducted, wherein the first number is larger than the second number.

4. The ESD protection device of claim 1, wherein when the internal circuit is operated in a data reading stage or a data writing stage, a first number of the plurality of ESD protection units are conducted, wherein when the internal circuit is operated in an idle stage, a second number of the plurality of ESD protection units are conducted, wherein the first number is smaller than the second number.

5. The ESD protection device of claim 1, wherein the conduction of each of the plurality of ESD protection units and the determined number of the plurality of ESD protection units are determined according to a tolerable capacitance value of the internal circuit.

6. The ESD protection device of claim 1, wherein when the internal circuit is operated in a high speed transmission mode, a first number of the plurality of ESD protection units are conducted, wherein when the internal circuit is operated in a low speed transmission mode, a second number of the plurality of ESD protection units are conducted, wherein the first number is smaller than the second number.

7. An ESD protection method, suitable for an ESD protection device, wherein the ESD protection device is configured to protect an internal circuit, wherein the ESD protection method comprises:

receiving a control signal by a control circuit of the ESD protection device, wherein the control signal comprises a protection level and a determined number; and controlling a conduction of each of a plurality of ESD protection units of a ESD protection array of the ESD protection device according to the control signal by the control circuit so that the determined number of the plurality of ESD protection units are conducted;

wherein the ESD protection method further comprises;

detecting a voltage value or a current value of the internal circuit by a detecting circuit; and deciding the conduction of each of the plurality of ESD protection units and the determined number according to the voltage value or the current value of the internal circuit.

8. The ESD protection method of claim 7, wherein the plurality of ESD protection units comprises a first ESD protection unit, a second ESD protection unit, and a third ESD protection unit, wherein the first ESD protection unit and the second ESD protection unit are connected in series, and the first ESD protection unit and the third ESD protection unit are connected in parallel.

9. The ESD protection method of claim 7, further comprising:

conducting a first number of the plurality of ESD protection units when the internal circuit is operated in a starting stage and a variation of a working voltage of the internal circuit is higher than a variation threshold; and conducting a second number of the plurality of ESD protection units when the internal circuit is not operated in the starting stage and the variation of the working voltage of the internal circuit is not higher than the variation threshold;

wherein the first number is larger than the second number.

10. The ESD protection method of claim 7, further comprising:

conducting a first number of the plurality of ESD protection units when the internal circuit is operated in a data reading stage or a data writing stage; and conducting a second number of the plurality of ESD protection units when the internal circuit is operated in an idle stage;

wherein the first number is smaller than the second number.

11. The ESD protection method of claim 7, wherein the conduction of each of the plurality of ESD protection units and the determined number of the plurality of ESD protection units are determined according to a tolerable capacitance value of the internal circuit.

12. The ESD protection method of claim 7, further comprising:

conducting a first number of the plurality of ESD protection units when the internal circuit is operated in a high speed transmission mode; and conducting a second number of the plurality of ESD protection units when the internal circuit is operated in a low speed transmission mode;

wherein the first number is smaller than the second number.

* * * * *